(12) United States Patent
Bak

(10) Patent No.: US 12,278,177 B2
(45) Date of Patent: Apr. 15, 2025

(54) SEMICONDUCTOR DEVICE MANUFACTURING METHOD

(71) Applicant: SK keyfoundry Inc., Cheongju-si (KR)

(72) Inventor: Jeong Geun Bak, Cheongju-si (KR)

(73) Assignee: SK keyfoundry Inc., Cheongju-si (KR)

(*) Notice: Subject to any disclaimer, the term of this patent is extended or adjusted under 35 U.S.C. 154(b) by 683 days.

(21) Appl. No.: 17/521,959

(22) Filed: Nov. 9, 2021

(65) Prior Publication Data

US 2022/0310513 A1    Sep. 29, 2022

(30) Foreign Application Priority Data

Mar. 29, 2021  (KR) .................. 10-2021-0040320

(51) Int. Cl.
| | |
|---|---|
| *H01L 23/522* | (2006.01) |
| *H01C 7/00* | (2006.01) |
| *H01L 21/311* | (2006.01) |
| *H01L 21/768* | (2006.01) |

(Continued)

(52) U.S. Cl.
CPC ......... *H01L 23/5228* (2013.01); *H01C 7/006* (2013.01); *H01L 21/31116* (2013.01); *H01L 21/31144* (2013.01); *H01L 21/76877* (2013.01); *H01L 23/5223* (2013.01);
(Continued)

(58) Field of Classification Search
CPC ............. H01L 27/0682; H01L 27/0794; H01L 27/1255; H01L 29/7408; H01L 2924/1205; H01L 2027/11842; H01L 23/5228; H01L 21/31116; H01L 23/5223; H01C 7/006
See application file for complete search history.

(56) References Cited

U.S. PATENT DOCUMENTS

| | | |
|---|---|---|
| 7,943,562 B2 | 5/2011 | Lee et al. |
| 8,159,046 B2 | 4/2012 | Cho et al. |
| 8,445,991 B2 | 5/2013 | Cho et al. |

(Continued)

FOREIGN PATENT DOCUMENTS

| | | |
|---|---|---|
| KR | 10-2006-0127502 A | 12/2006 |
| KR | 10-2009-0061354 A | 6/2009 |

(Continued)

OTHER PUBLICATIONS

Korean Office Action issued Jan. 30, 2022 in corresponding Korean Patent Application No. 10-2021-0040320 (5 pages in Korean language).

*Primary Examiner* — Phat X Cao
(74) *Attorney, Agent, or Firm* — NSIP Law

(57) ABSTRACT

A method of manufacturing a semiconductor device is provided. The method includes depositing a first interconnect metal layer on a substrate; depositing a first barrier metal layer on the first interconnect metal layer; depositing a first dielectric layer on the first barrier metal layer; depositing a second barrier metal layer on the first dielectric layer; etching the second barrier metal layer to form a MIM capacitor region and a thin film resistor region; forming a hard mask on the second barrier metal layer and the first dielectric layer; forming an isolated interconnect pattern between the MIM capacitor region and the thin film resistor region; depositing an inter-metal dielectric layer on the hard mask; forming Via holes in the MIM capacitor region and the thin film resistor region, and filling the Via holes with metal to form a Via contact layer.

17 Claims, 13 Drawing Sheets

(51) Int. Cl.
*H10D 1/47* (2025.01)
*H10D 1/68* (2025.01)

(52) U.S. Cl.
CPC ......... *H01L 23/5226* (2013.01); *H10D 1/474* (2025.01); *H10D 1/692* (2025.01)

(56) References Cited

U.S. PATENT DOCUMENTS

| | | |
|---|---|---|
| 8,530,323 B2 | 9/2013 | Cho et al. |
| 9,099,300 B2 | 8/2015 | Kim et al. |
| 10,199,214 B2 | 2/2019 | Kim et al. |
| 10,658,455 B2 | 5/2020 | Hsu et al. |
| 10,916,419 B2 | 2/2021 | Kim et al. |
| 2003/0011043 A1* | 1/2003 | Roberts .................. H01L 28/40 257/532 |
| 2005/0272219 A1* | 12/2005 | Coolbaugh ......... H01L 23/5223 257/E27.048 |
| 2008/0096332 A1* | 4/2008 | Lee .................... H01L 27/1288 438/151 |
| 2009/0093107 A1 | 4/2009 | Lee et al. |
| 2010/0155889 A1* | 6/2010 | Cho ....................... H01L 28/60 257/532 |
| 2019/0096986 A1 | 3/2019 | Hsu et al. |
| 2021/0313513 A1* | 10/2021 | Lutker-Lee .......... H10N 70/841 |
| 2022/0045049 A1* | 2/2022 | Hung .................... H01L 28/60 |

FOREIGN PATENT DOCUMENTS

| | | |
|---|---|---|
| KR | 10-1044386 B1 | 6/2011 |
| KR | 10-1100758 B1 | 12/2011 |
| KR | 10-2019-0037076 A | 4/2019 |

\* cited by examiner

SEMICONDUCTOR DEVICE MANUFACTURING METHOD

CROSS-REFERENCE TO RELATED APPLICATIONS

This application claims the benefit under 35 U.S.C. 119(a) of Korean Patent Application No. 10-2021-0040320 filed on Mar. 29, 2021, in the Korean Intellectual Property Office, the entire disclosure of which is incorporated herein by reference for all purposes.

BACKGROUND

1. Field

The following description relates to a semiconductor device manufacturing method.

2. Description of Related Art

The incorporation of a plurality of functions in a single device has become advantageous in terms of technological competitiveness and market share.

Among semiconductor devices, various structures such as polysilicon vs. polysilicon, metal vs. silicon, metal vs. polysilicon, metal vs. metal are implemented as capacitors disposed in highly integrated semiconductor devices. Among these capacitor structures, a metal/insulator/metal (MIM) structure has a low series resistance that enables manufacturing of a capacitor having a high storage capacity, and is widely used due to its low thermal stability.

In addition to the MIM capacitor, a resistor or an inductor is implemented in the semiconductor device. In particular, a thin film resistor (TFR) may be formed on the same layer as the MIM capacitor.

Such a MIM capacitor and a thin film resistor are one of the most widely used electronic devices, and the MIM capacitor uses mainly TiN (Titanium Nitride) as an electrode material, and the thin film resistor uses mainly TaN (Tantalum Nitride).

However, in order to put a MIM capacitor using TiN as an electrode and a TaN thin film resistor in the same device, a MIM capacitor pattern and a thin film resistor pattern are to be separately formed. For this reason, a photo lithography process and a mask for forming a pattern are additionally required, and time and cost are significantly consumed for the etching process and the subsequent cleaning process.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor device manufacturing method includes depositing a first interconnect metal layer on a substrate; depositing a first barrier metal layer on the first interconnect metal layer; depositing a first dielectric layer on the first barrier metal layer; depositing a second barrier metal layer on the first dielectric layer; forming a metal/insulator/metal (MIM) capacitor region and a thin film resistor (TFR) region by etching the second barrier metal layer; forming a hard mask on the second barrier metal layer and the first dielectric layer; forming an isolated interconnect pattern between the MIM capacitor region and the TFR region; depositing an inter-metal dielectric layer on the hard mask; and forming Via holes in the MIM capacitor region and the TFR region, and forming a Via by filling the Via holes with a metal.

The depositing of the first barrier metal layer may include depositing Ti and TiN on the first interconnect metal layer.

The depositing of the first dielectric layer may include depositing the first dielectric layer to be thinner than the first barrier metal layer.

The depositing of the second barrier metal layer may include depositing TaN on the first dielectric layer.

The forming of the MIM capacitor region and the TFR region may include simultaneously etching the second barrier metal layer and a portion of the first dielectric layer.

The forming of the MIM capacitor region and the TFR region may include performing a first etching of the second barrier metal layer; and performing a second etching of the first dielectric layer from which the second barrier metal layer is removed.

The forming of the MIM capacitor region and the TFR region may include performing the first etching with a chlorine-based plasma and performing the second etching with one of a nitrogen-based plasma and an oxygen-based plasma.

The forming of the MIM capacitor region and the TFR region, may further include performing a cleaning operation with a Tetra Methyl Ammonium Hydroxide (TMAH) solution, and removing a by-product of the second barrier metal layer.

The forming of the Via may include respectively forming first Via holes in the MIM capacitor region up to the first barrier metal layer and the second barrier metal layer, and forming second Via holes in the TFR region up to the second barrier metal layer.

The method may include depositing a second interconnect metal layer on the inter-metal dielectric layer and the Via contact layer; and forming an interconnect pattern by etching the second interconnect metal layer.

In a general aspect, a semiconductor device manufacturing method includes forming a first barrier metal layer on a first interconnect layer; forming an dielectric layer on the first barrier metal layer; forming a second barrier metal layer on the first dielectric layer; performing a first etching process on the second barrier metal layer; performing a second etching process on the dielectric layer; forming a metal/insulator/metal (MIM) capacitor region and a thin film resistor (TFR) region based on the first etching process and the second etching process; forming a first Via of a first depth and a second Via of a second depth in the MIM capacitor region, and forming a third Via and a fourth Via in the TFR region.

The first etching process may be a chlorine-based plasma etching process, and the second etching process is one of a nitrogen-based plasma etching process and an oxygen-based plasma etching process.

The dielectric layer may be partially etched.

Other features and aspects will be apparent from the following detailed description, the drawings, and the claims.

Figure 1:
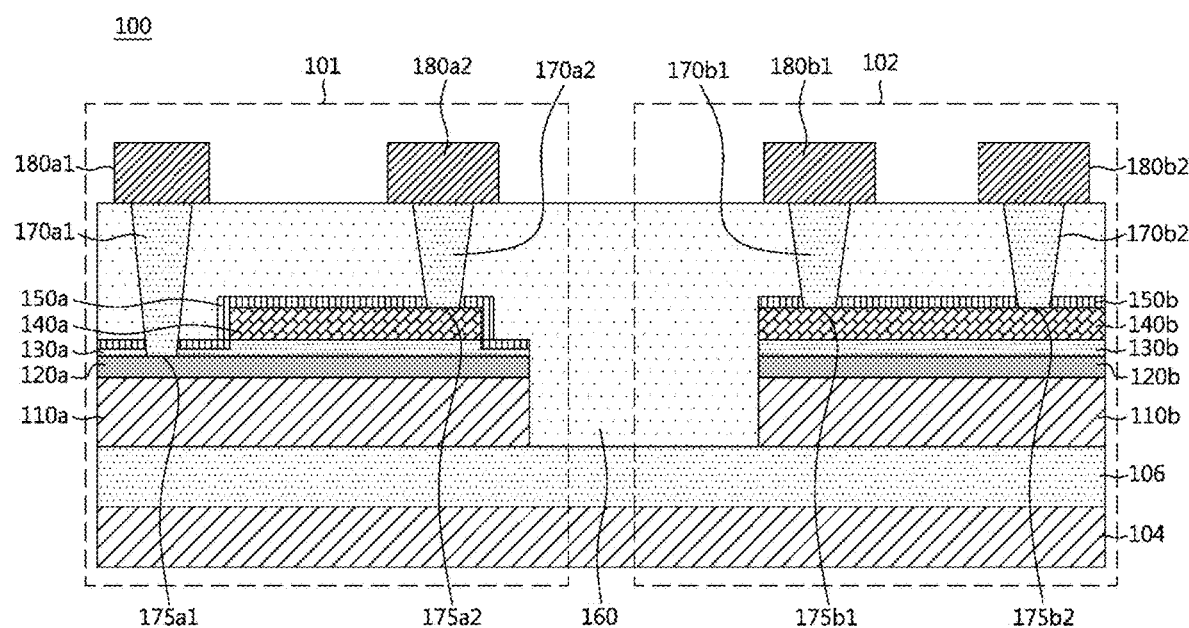
FIG. 1 illustrates a cross-section of an example semiconductor device, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Hereinafter, the present disclosure is described in more detail with respect to the accompanying drawings.

FIG. 1 illustrates a cross-section of an example semiconductor device, in accordance with one or more embodiments.

Referring to FIG. 1, a semiconductor device 100, in accordance with one or more embodiments, is provided with a capacitor 101 and a thin film resistor 102. In an example, the capacitor 101 may be a Metal Insulator Metal (MIM) capacitor, and the thin film resistor 102 may be a TaN resistor. The capacitor 101 and the thin film resistor 102 are formed in a first region and a second region, respectively. The capacitor 101 and the thin film resistor 102 are formed on the substrate 104. A pre-metal dielectric layer 106 may be formed on the substrate 104. An inter-metal dielectric layer (IMD) 160 is deposited to separate the MIM capacitor and the TFR.

The MIM capacitor 101 may comprise a first lower metal 110a on a substrate 104; a first barrier metal 120a formed on the first lower metal 110a; a first dielectric layer 130a on the first barrier metal 120a; a first metal nitride 140a formed on the first dielectric layer 130a; a first hard mask 150a formed on the first metal nitride 140a; a first Via 170a1 connected to the first barrier metal 120a; and a second Via 170a2 connected to the first metal nitride 140a; and one or more upper metals 180a1 and 180a2 connected to the first Via 170a1 and the second Via 170a2, respectively.

In the MIM capacitor 101, the first dielectric layer 130a has thin and thick portions, wherein the thin portion is located outside from the first metal nitride 140a, and the thick portion is located under the first metal nitride 140a. The first hard mask 150a is in direct contact with the top and side surfaces of the first metal nitride 140a. Additionally, the first hard mask 150a is also in direct contact with the thin and thick portion of the first dielectric layer 130a.

In the MIM capacitor 101, a first Via 170a1 of the capacitor may be connected between the first barrier metal 120a and the first upper metal 180a1. A second Via 170a2 may be connected between the first metal nitride 140a and the second upper metal 180a2. Additionally, the first lower metal 110a may be directly connected to the first barrier metal 120a.

The thin film resistor 102 may comprise a second lower metal 110b on a substrate 104, and formed in a same plane with the first lower metal 110a; a second barrier metal 120b formed on the second lower metal 110b, and formed in a same plane with the first barrier metal 120a; a second dielectric layer 130b on the second barrier metal 120b, and formed in a same plane with the first dielectric layer 130a; a second metal nitride 140b formed on the second dielectric layer 130b, and formed in a same plane with the first metal nitride 140a; a second hard mask 150b formed on the second metal nitride 140b, wherein a lower surface of the first hard mask 150a and a lower surface of the second hard mask 150b are in different planes; and a third Via 170b1 and a fourth Via 170b2 connected to the second metal nitride 140b; and one or more upper metals 180b1 and 180b2 connected to the third Via 170b1 and the fourth Via 170b2, respectively.

In the TFR, the second lower metal 110b and second barrier metal 120b of the thin film resistor 102 may be electrically disconnected from the second metal nitride 140b by the second dielectric layer 130b. The second hard mask 150b is formed only on the second metal nitride 140b. The shape and structure of the second hard mask 150b is different from the first hard mask 150a.

Referring to FIG. 1, Via holes are formed in the MIM capacitor region and the thin film resistor region, and the Via 170 is formed by filling the Via holes with metal.

Respective first and second Via holes 175a1 and 175a2 formed in the MIM capacitor region may be formed to have depths that are different from each other, and may be respectively formed to a depth that reaches the first barrier metal 120a, and a depth that reaches the first metal nitride 140a. The Via first hole 175a1 is connected between the first barrier metal 120a and the first upper metal 180a1, and the second Via hole 175a2 is connected between the first metal nitride 140a and the second upper metal 180a2.

On the other hand, third and fourth Via holes 175b1 and 175b2 formed in the thin film resistor region may be formed to the same depth, and may be formed to a depth that reaches to the second metal nitride 140b.

Referring to FIG. 1, the MIM capacitor 101 and the thin film resistor 102 may be formed at the same time. In forming the two devices 101 and 102 at the same time, the photolithography process and the etching process may be simultaneously performed, and the number of masks may be reduced.

In an example, the first lower metal 110a, the first barrier metal 120a, the first dielectric layer 130a, the first metal nitride 140a, and the first hard mask 150a are formed of same materials with respect to the second lower metal 110b, the second barrier metal 120b, the second dielectric layer 130b, the second metal nitride 140b, and the second hard mask 150b. For example, the first barrier metal 120a and the second barrier metal 120b are formed of same materials, TiN. The first metal nitride 140a and the second metal nitride 140b are formed of same materials, TaN.

The semiconductor device 100, in accordance with one or more embodiments, may form a capacitor 101 and a thin film resistor 102 at the same time, thereby reducing a number of semiconductor processes, such as a photolithography process, an etching and cleaning process of a thin film resistor (TFR), depositing and planarization processes of the dielectric layer and depositing processes of the thin film resistor TFR. Additionally, because the capacitor 101 and the thin film resistor 102 may be formed at the same time, one or more photo masks may be reduced, thereby saving cost and time.

Hereinafter, a process of a manufacturing method of the semiconductor device 100, in accordance with one or more embodiments, is described in detail.

FIGS. 2 to 10 are process diagrams illustrating a method of manufacturing a semiconductor device, in accordance with one or more embodiments.

Figure 2:
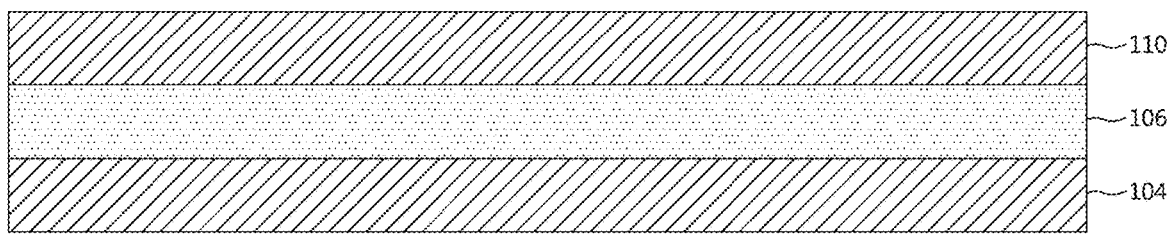
FIGS. 2 to 11 are process diagrams illustrating a method of manufacturing a semiconductor device, in accordance with one or more embodiments.

Referring to FIG. 2, a pre-metal dielectric layer 106 is formed on the substrate 104. Here, the substrate 104 may be, as an example, a silicon substrate. Phosphorus-doped silicon oxide (PSG) or boron-phosphorous doped silicon oxide (BPSG) or tetra ethyl ortho silicate oxide (TEOS) are used for pre-metal dielectric layer 106. A lower metal layer 110 is deposited on the pre-metal dielectric layer 106. Because, as examples, a number of stacked structures may be implemented under the lower metal layer 110, and various structures are possible, only the layers necessary to form the MIM capacitor and the thin film resistor (TFR) are illustrated. In this example, the lower metal layer 110 may be formed of a metal having conductivity. Preferably, the lower metal layer 110 may be made of copper (Cu) or aluminum (Al) and deposited on the substrate 102. However, these are only examples, and the lower metal layer 110 may be composed of other materials.

Figure 3:
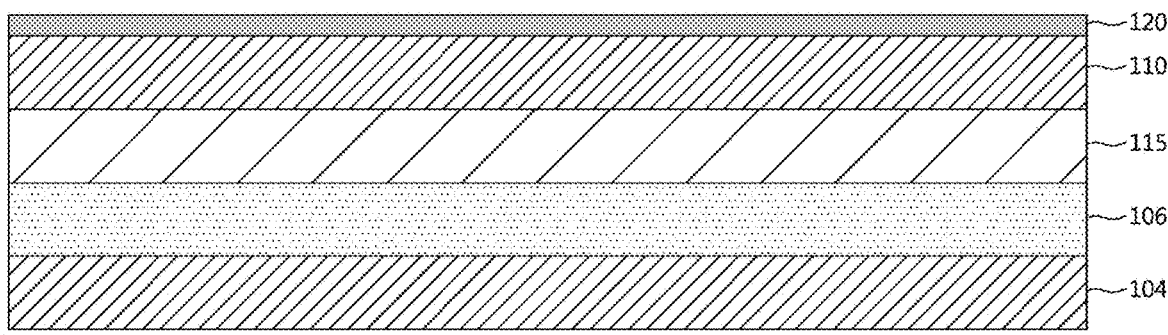

Referring to FIG. 3, a barrier metal layer 120 is deposited on the lower metal layer 110. In an example, the barrier metal layer 120 may be thinner than the lower metal layer 110, and may be thicker than the dielectric layer 130. The barrier metal layer 120 may deposit Ti on the lower metal layer 110 and may also deposit TiN on the lower metal layer 110. That is, the barrier metal layer 120 may be formed of a double layer of Ti/TiN.

Figure 4:
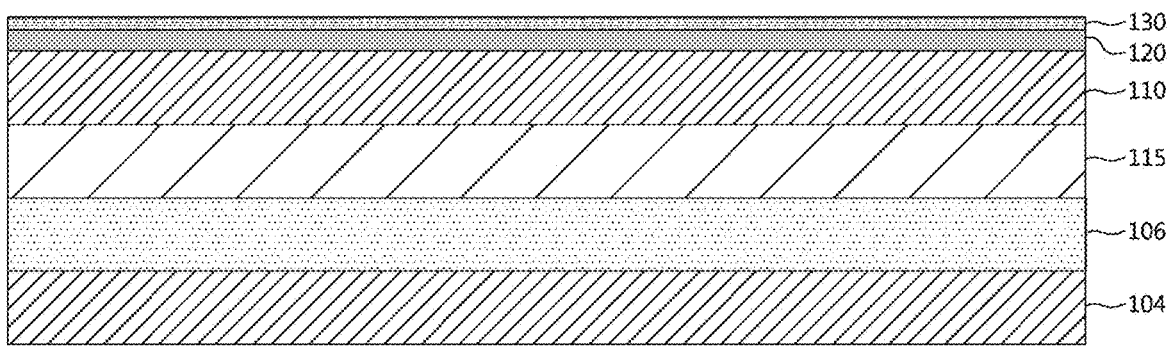

Referring to FIG. 4, a dielectric layer 130 is deposited on the barrier metal layer 120. Here, in an example, the dielectric layer 130 may be deposited to be thinner than the barrier metal layer 120. The dielectric layer 130 may be formed, as examples, of SiON, SiN, SiO2, etc., and may be deposited by using mainly SiN. The dielectric layer 130 may prevent a leakage current generated when an etch by product (a metallic material generated during etching) is connected to the lower barrier metal layer 120.

Figure 5:
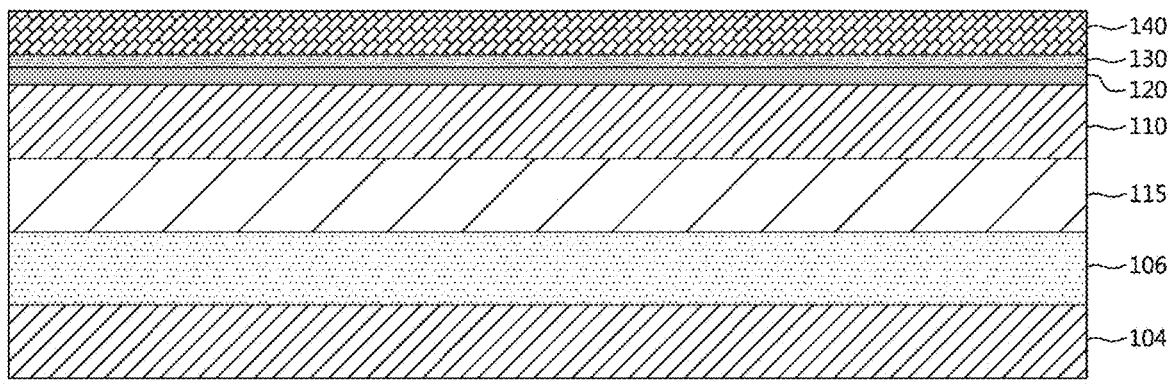

Referring to FIG. 5, a metal nitride layer 140 is deposited on the dielectric layer 130. The metal nitride layer 140 may deposit TaN on the dielectric layer 130. TaN has superior properties in terms of capacitance and resistance compared to a material such as TiN which is used as an first metal nitride of a MIM capacitor. Additionally, TaN has excellent resistance to etching such that a thickness of a layer may be formed to be thin compared to TiN etc, which is advantageous in terms of properties and processes. It is preferable that the metal nitride layer 140 is thicker than the barrier metal layer 120. This is because the metal nitride layer 140 has a region that is removed through an etching process to form the MIM capacitor region, and the barrier metal layer 120 is protected by the dielectric layer 130 serving as a residual film.

Figure 6:
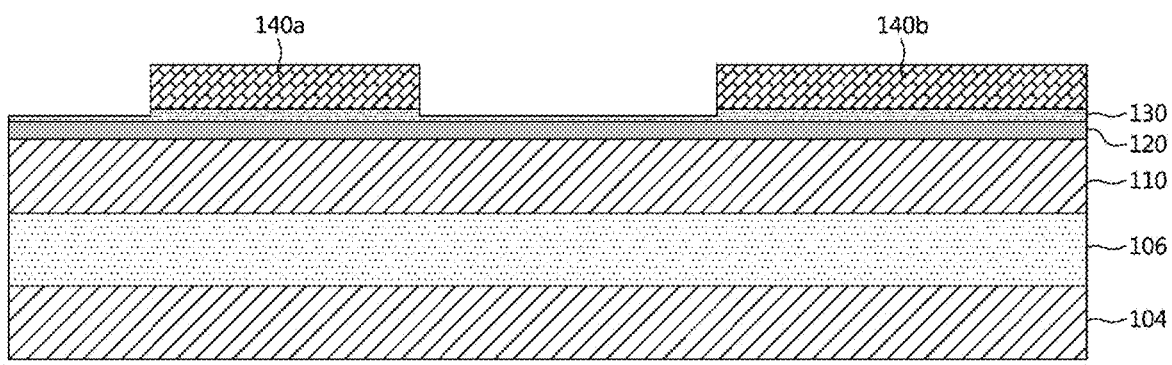

Referring to FIG. 6, the metal nitride layer 140 is etched to form a first metal nitride 140a and a second metal nitride 140b. In an example, the MIM capacitor region and the thin film resistor region may be divided for convenience before final formation of the MIM capacitor and the thin film resistor as a device. In FIG. 6, the left side may be implemented as the MIM capacitor region, and the right side may be implemented as the thin film resistor region.

When the metal nitride layer 140 is etched to form the first metal nitride 140a and the second metal nitride 140b, these metal nitrides 140a and 14b may be simultaneously formed by a photolithography process and an etching process. Since the photolithography process of forming the pattern may be simultaneously performed to form the first metal nitride 140a and the second metal nitride 140b, processing time and processing costs may be saved, and one or more photo masks may be reduced.

In an example, the metal nitride layer 140 may be etched until the dielectric layer 130 is exposed. Therefore, the first metal nitride 140a and the second metal nitride 140b may be formed in the MIM capacitor region and the thin film resistor (TFR) region, respectively. The dielectric layer 130 is used as an etch stop layer during the etching process of the metal nitride layer 140. Even after etching the metal nitride layer 140, the dielectric layer 130 is still remained on the barrier metal layer 120. Thus, the barrier metal layer 120 is protected by the remaining dielectric layer 130. The first metal nitride 140a becomes a top electrode in the MIM capacitor. The second metal nitride 140b becomes a thin film resistor in the TFR region.

A two-stage etching process is performed to form the first metal nitride 140a and the second metal nitride 140b. The metal nitride layer 140 is first-etched, and the dielectric layer 130 is second-etched. In such a two-stage etching, a first etching is performed by using a chlorine-based plasma, and a second etching may be performed by using a nitrogen-based plasma or an oxygen-based plasma.

The metal nitride layer 140 has etching resistance higher than the dielectric layer 130 such that it is difficult to be uniformly etched. When the metal nitride layer 140 is TaN, it has etching resistance relatively higher compared to TiN, thus, the metal nitride layer 140 is etched by using a chlorine-based plasma.

Additionally, a nitrogen-based or oxygen-based plasma is preferred to partially etch the dielectric layer 130, because the nitrogen-based or the oxygen-based plasma make it helpful for formation of passivation layer on the dielectric layer 130.

During the two-stage etching process, the dielectric layer 130 is not to be completely etched in order to prevent leakage current of the MIM capacitor. The leakage path can be formed between the barrier metals 120a and 120b and the metal nitrides 140a and 140b due the metal residue generated by the two-stage etching process. If the dielectric layer 130 is completely removed after the two-stage etching process, a metal residue produced by the etching process may be remained to electrically connect between the barrier metal layer 120 and the metal nitrides 140a and 140b. Then, unwanted leakage current is produced in the MIM capacitor. So it is required that the dielectric layer 130 covers a top surface of the barrier metal layer 120 during the two-stage etching process.

Next, a cleaning process may be performed to completely remove the metal residue or byproducts. The cleaning process is performed with a TMAH (Tetra Methyl Ammonium Hydroxide) solution. Before removing the photoresist, a TMAH (Tetra Methyl Ammonium Hydroxide) solution is wetting on the wafer for an enough time to react the TMAH chemicals with the metal residue. Then, wafer rotation is performed to remove the metal residue. The effect of the etching process and the cleaning process of these two operations are described later.

Figure 7:
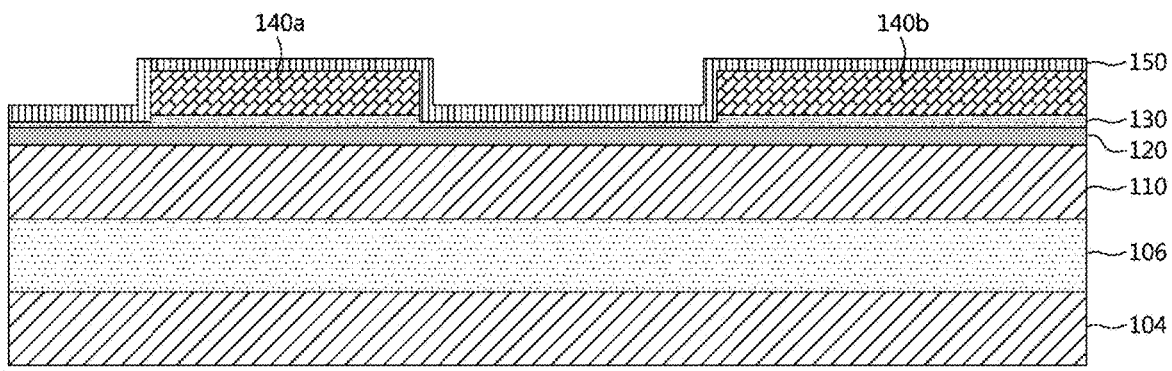

Referring to FIG. 7, a hard mask layer 150 is formed on the metal nitride layer 140 and the dielectric layer 130. In order to form the hard mask layer 150, a dielectric material such as SiON, SiN, and SiO2 may be deposited.

Figure 8:
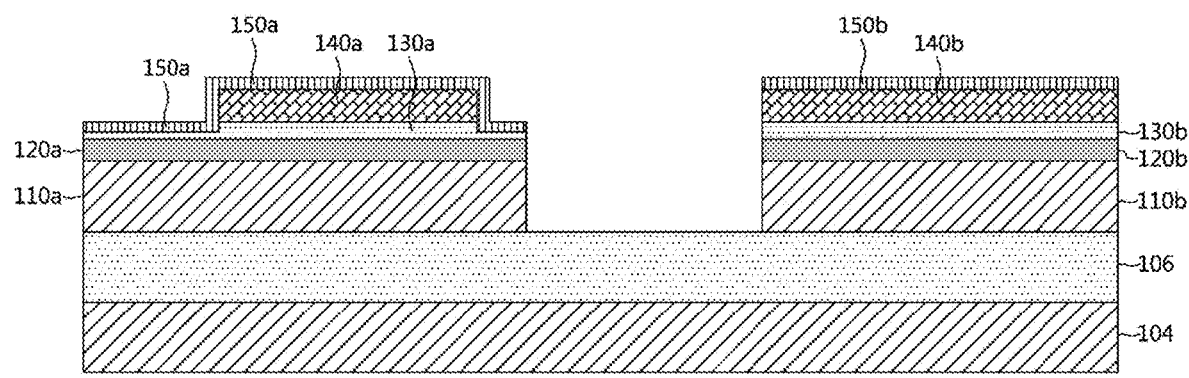

Referring to FIG. 8, a plasma etching process is performed to electrically isolate the MIM capacitor and thin film resistor (TFR). The plasma etch process is performed to etch the hard mask layer 150, the dielectric layer 130, the barrier metal layer 120 and the lower metal layer 110. Thereby, a first hard mask 150a, a first metal nitride 140a, a first dielectric layer 130a, a first barrier metal 120a, a first lower metal 110a are formed in the MIM capacitor region (left). A second hard mask 150b, a second nitride 140b, a second dielectric layer 130b, a second barrier metal 120b, a second lower metal 110b are also formed in the TFR region (right).

First and second barrier metals 120a and 120b are formed on the first and second lower metals 110a and 110b, respectively. First and second dielectric layers 130a and 130b are formed on the first and second barrier metals 120a and 120b, respectively. First and second metal nitrides 140a and 140b are formed on the first and second dielectric layers 130a and 130b, respectively. Accordingly, the MIM capacitor 101 may comprise a first lower metal 110a, a first barrier metal 120a, a first dielectric layer 130a and a first metal nitride 140a. The thin film resistor 102 may comprise a second lower metal 110b, a second barrier metal 120b, a second dielectric layer 130b and a second metal nitride 140b.

Referring to FIG. 8, the first dielectric layer 130a has thin and thick portions, wherein the thin portion is located outside from the first metal nitride 140a, and the thick portion is located under the first metal nitride 140a. The shape and structure of the first hard mask 150a is different from the second hard mask 150b. The first hard mask 150a is in direct contact with the top and side surfaces of the first metal nitride 140a. Additionally, the first hard mask 150a is also in direct contact with the thin and thick portion of the first dielectric layer 130a.

Figure 9:
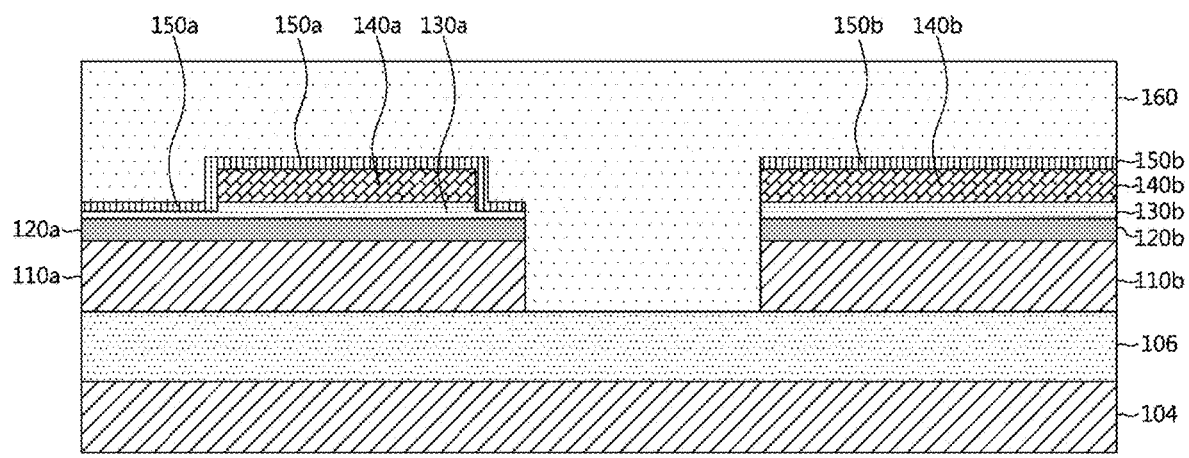

Referring to FIG. 9, an inter-metal dielectric layer (IMD) 160 is deposited to cover the MIM capacitor and the TFR. Here, the inter-metal dielectric layer 160 may use dielectric material such as SiON, SiN, or SiO2, and SiO2 may be used mainly. In this example, after the inter-metal dielectric layer 160 is deposited, the inter-metal dielectric layer 160 may be planarized through a process such as etching or chemical mechanical polishing (CMP).

Figure 10:
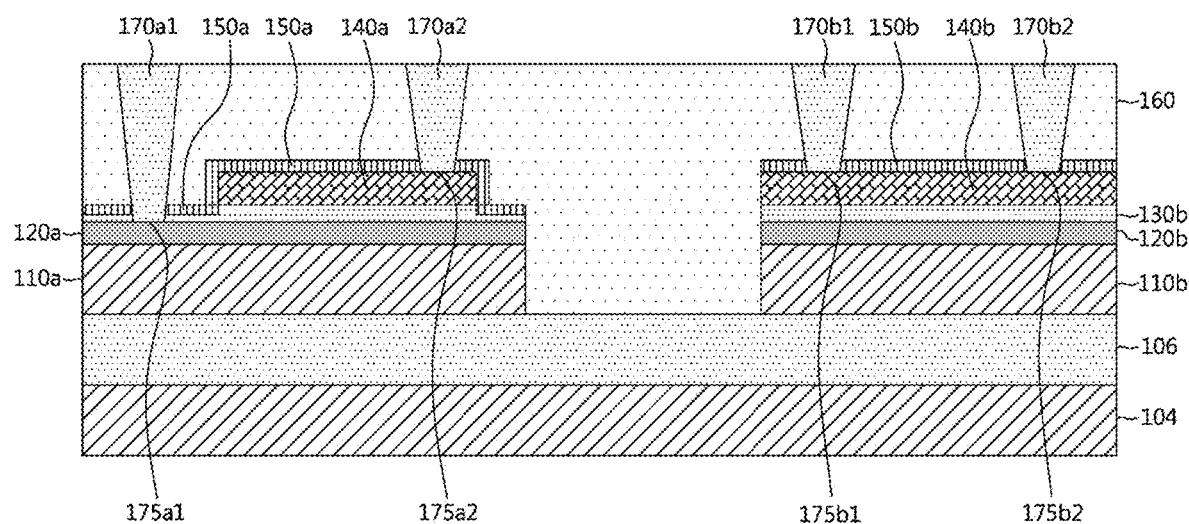

Referring to FIG. 10, Via holes 175a1, 175a2, 175b1 and 175b2 are formed in the MIM capacitor region and the thin film resistor region, and one or more Vias 170a1, 170a2, 170b1 and 170b2 are formed by filling the Via holes 175a1, 175a2, 175b1 and 175b2 with metal. Respective Via holes 175a1 and 175a2 formed in the MIM capacitor region may be formed to have depths that are different from each other, and may be respectively formed to a depth that reaches the first barrier metal 120a, and a depth that reaches the first metal nitride 140. The first Via hole 175a1 connected to the first barrier metal 120a, and the second Via hole 175a2 connected to the first metal nitride 140a of the capacitor.

On the other hand, Via holes 175b1 and 175b2 formed in the thin film resistor region may be formed to the same depth, and may be formed to a depth that reaches to the second metal nitride 140b.

Via holes 175a1, 175a2, 175b1, and 175b2 may respectively be formed in the MIM capacitor region and the thin film resistor region through a photolithography process and an etching process, and metal is deposited to fill the formed Via holes. Here, the metal deposited on the Via holes is a material having conductivity, and in particular, the Via holes may be filled with, as an example, tungsten.

In this example, the Vias 170a1, 170a2, 170b1 and 170b2 may be planarized by removing the metal remained after filling the Via holes 175a1, 175a2, 175b1, and 175b2 through a chemical mechanical polishing (CMP) process.

Figure 11:
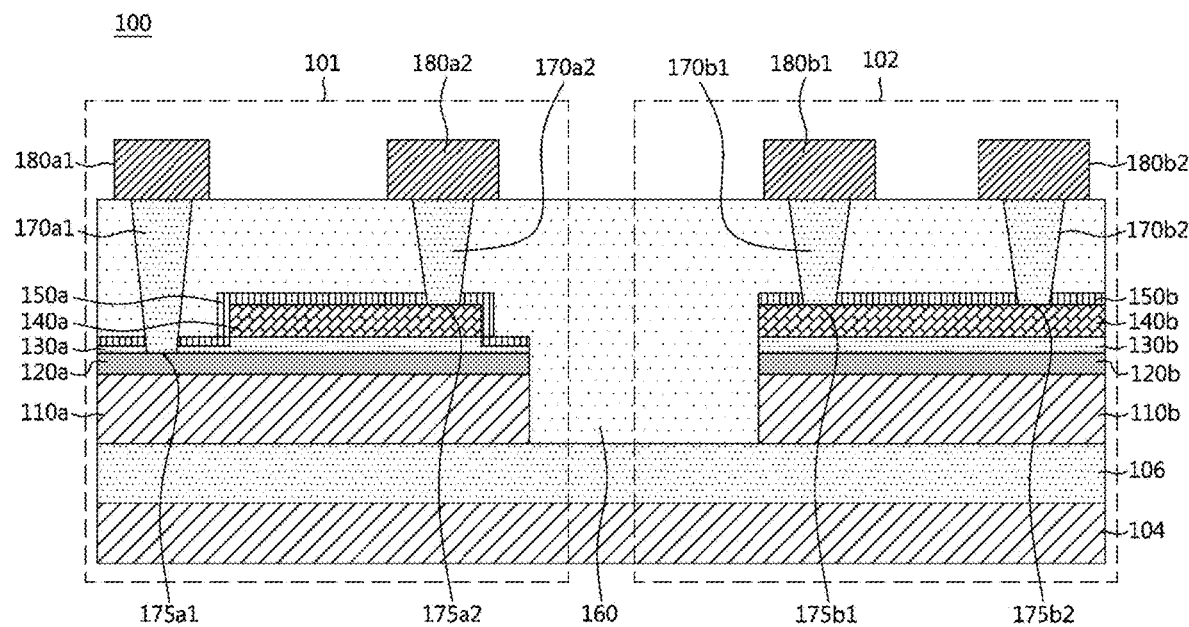

Referring to FIG. 11, the upper metals 180a1, 180a2, 180b1 and 180b2 are formed on the inter-interconnect dielectric layer 160. The upper metals 180a1, 180a2, 180b1 and 180b2 are connected to the Vias 170a1, 170a2, 170b1 and 170b2, respectively. Then the simultaneous manufacture of the MIM capacitor 101 and the thin film resistor 102 is completed. A cross-section of the semiconductor device including such a MIM capacitor 101 and a thin film resistor 102 is illustrated in FIG. 1, and a detailed configuration thereof is as described above.

Figure 12:
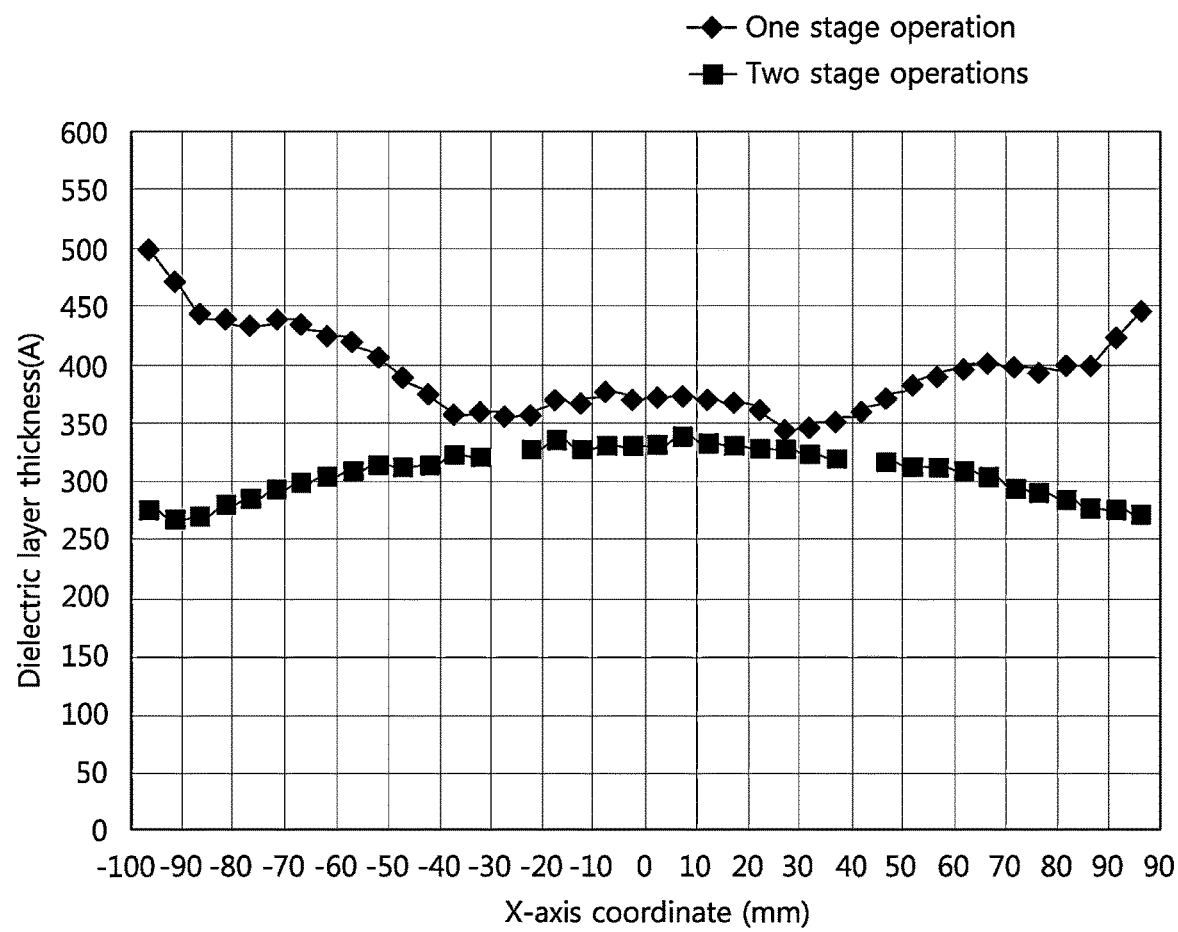
FIG. 12 is a graph illustrating a comparison of a thickness of an dielectric layer according to the etching process of an alternative art and that of the etching process, in accordance with one or more embodiments.

FIG. 12 is a graph illustrating a comparison of the thickness of a dielectric layer according to a typical etching process and the etching process according to the present disclosure.

FIG. 12 shows the thickness of the remaining dielectric layer 130 versus the location. As explained before, the TaN film as a metal nitride layer 140 is deposited on the dielectric layer 130, for example, SiN, and then, a reactive plasma etching (RIE) process is performed to etch the TaN film. The SiN insulator film may be left with a certain thickness even after the plasma reactive ion etching (RIE) process. 40 points were measured by using the X-axis scan method. Here, the etching process of one stage operation is performed in the typical etching process, and the etching process of two stage operations is performed in the etching process according to the present disclosure.

As illustrated in FIG. 12, uniformity of the thickness of the remaining dielectric layer 130 according to the etching process according to the present disclosure is excellent. The thickness of the SiN dielectric layer 130 according to the typical etching process has a big difference between the maximum value and the minimum value such as 150 Å or more, while the thickness of the SiN dielectric layer 130 according to the etching process according to the present disclosure is uniformly etched with a difference between the maximum value and the minimum value of 70 Å.

The two stage operations comprise first etching and second etching. The first etching is based on Cl (Chlorine)-based plasma. and the second etching is based on nitrogen plasma or oxygen plasma based plasma.

Figure 13A:
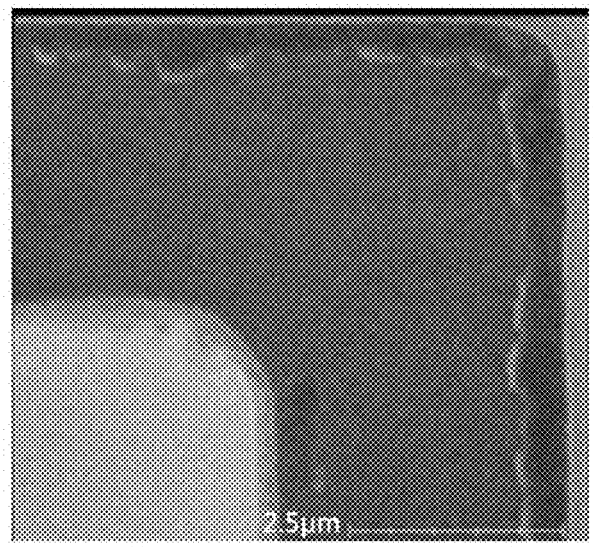
FIGS. 13A and 13B illustrate a SEM photograph of the MIM capacitor according to the cleaning process of an alternative art and the cleaning process, in accordance with one or more embodiments.
Figure 13B:
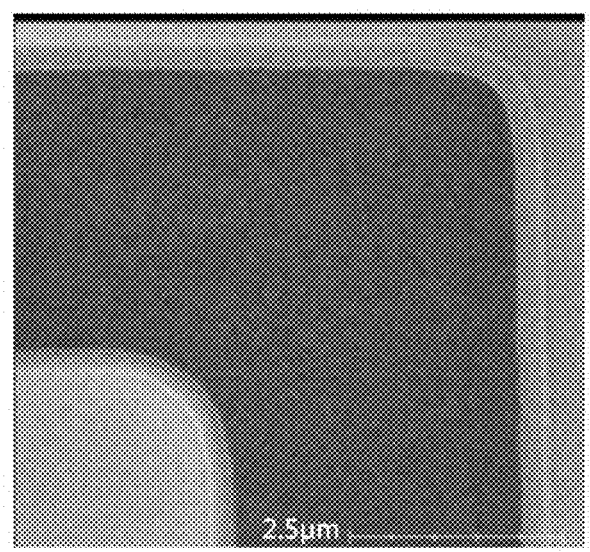

FIG. 13A illustrates a SEM photograph of the MIM capacitor according to the typical cleaning process, and FIG. 13B illustrates the cleaning process according to the present disclosure.

Referring to FIG. 13, it is a SEM photograph of a MIM capacitor pattern that has been cleaned before removing the photoresist after etching the TaN film. The typical cleaning process, as illustrated in FIG. 13A, is the result of cleaning at a constant speed immediately after applying the cleaning solution. The cleaning process according to the present disclosure, as illustrated in FIG. 13B, is the result of cleaning by repeating the method of increasing the speed after waiting a certain time after applying the cleaning solution. The cleaning process according to the present disclosure may repeat the waiting time for 1 to 5 minutes and cleaning for 2 to 5 times. In FIG. 13B, the metallic etch byproducts are completely removed.

Because the process of removing the photoresist is accompanied by high temperature, there is a problem that the etch byproducts are fixed, making it very difficult to remove by subsequent cleaning. However, by removing the photoresist after cleaning with the method to increase RPM after waiting after applying the TMAH solution thereon according to the present disclosure, etch byproducts may be completely removed.

The examples of the present disclosure are described above with reference to the accompanying drawings, but those of ordinary skill in the art to which the present disclosure pertains may understand that it is possible to implement the present disclosure in other specific forms without changing the technical spirit or essential features. Therefore, it should be understood that the examples described above are illustrative and not limiting in all respects.

According to the present disclosure, by manufacturing a semiconductor device provided with a MIM capacitor and a thin film resistor through an improved process, it is possible to reduce an etching process, a cleaning process, etc., and a photomask.

Therefore, it is possible to reduce the cost input to the process and the time to proceed the process, thereby improving productivity and economic efficiency.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device manufacturing method, the method comprising:
    forming a lower metal layer, a barrier metal layer, a dielectric layer and a metal nitride layer, sequentially, on a substrate;
    performing etching the metal nitride layer, thereby forming a first metal nitride, a second metal nitride;
    forming a hard mask layer directly disposed on the first metal nitride, the second metal nitride and the dielectric layer, the hard mask layer comprising an insulating layer;
    performing etching the hard mask layer, the dielectric layer, the barrier metal layer and the lower metal layer to form a metal/insulator/metal (MIM) capacitor and a thin film resistor (TFR), the MIM capacitor comprising a first hard mask, the first metal nitride, a first dielectric layer, a first barrier metal and a first lower metal, and the thin film resistor comprising a second hard mask, the second metal nitride, a second dielectric layer, a second barrier metal and a second lower metal;
    forming an inter-metal dielectric layer to cover the MIM capacitor and the thin film resistor; and
    forming a plurality of vias in the inter-metal dielectric layer, the plurality of vias comprising:
        a first via connecting the first barrier metal and forming through the first hard mask and the first dielectric layer in the MIM capacitor;
        a second via connecting the first metal nitride and forming through the first hard mask in the MIM capacitor; and
        a third via connecting the second metal nitride and forming through the second hard mask in the TFR,
    wherein the first metal nitride is enclosed by the first hard mask and the first dielectric layer.

2. The method of claim 1,
wherein the performing etching the hard mask layer, the dielectric layer, the barrier metal layer and the lower metal layer comprises:
forming the first hard mask, the first dielectric layer, the first barrier metal, the first lower metal on a first region, and
forming the second hard mask, the second dielectric layer, the second barrier metal, the second lower metal on a second region.

3. The method of claim 1,
wherein each sidewall of the second lower metal, the second barrier metal, the second dielectric layer and the second metal nitride is aligned with each other.

4. The method of claim 1,
wherein the first dielectric layer has thin and thick portions, and
wherein the thin portion is located outside from the first metal nitride, and the thick portion is located under the first metal nitride.

5. The method of claim 4,
wherein the first hard mask is in direct contact with a top and side surfaces of the first metal nitride, and
wherein the first hard mask is in direct contact with the thin and thick portions of the first dielectric layer.

6. The method of claim 1,
wherein the barrier metal layer comprises Ti, TiN or stacked layer, and
wherein the metal nitride layer comprises TaN.

7. The method of claim 1,
wherein the performing etching the metal nitride layer comprises:
a first etching of the metal nitride layer, wherein the first etching is performed using a chlorine-based plasma; and
a second etching of the dielectric layer, wherein the second etching is performed with one of a nitrogen-based plasma and an oxygen-based plasma.

8. The method of claim 1, further comprising:
performing a cleaning operation with a Tetra Methyl Ammonium Hydroxide (TMAH) solution to remove a metal residue produced by the performing etching the metal nitride layer.

9. A semiconductor device manufacturing method, comprising:
forming a lower metal layer, a barrier metal layer, a dielectric layer and a metal nitride layer, sequentially, on a substrate;
performing a first etching process on the metal nitride layer;
performing a second etching process on the dielectric layer;
forming a first metal nitride and a second metal nitride based on the first etching process;
forming a hard mask layer on the first metal nitride and the second metal nitride, the hard mask layer comprising an insulating layer;
performing etching the hard mask layer, the dielectric layer, the barrier metal layer and the lower metal layer to form a metal/insulator/metal (MIM) capacitor and a thin film resistor (TFR), the MIM capacitor comprising a first hard mask, the first metal nitride, a first dielectric layer, a first barrier metal and a first lower metal, and the thin film resistor comprising a second hard mask, the second metal nitride, a second dielectric layer, a second barrier metal and a second lower metal; and
forming a plurality of vias in the inter-metal dielectric layer, the plurality of vias comprising:
a first via connecting the first barrier metal and forming through the first hard mask and the first dielectric layer in the MIM capacitor;
a second via connecting the first metal nitride and forming through the first hard mask in the MIM capacitor; and
a third via connecting the second metal nitride and forming through the second hard mask in the TFR, and
wherein the first metal nitride is enclosed by the first hard mask and the first dielectric layer.

10. The method of claim 9, wherein the first etching process is a chlorine-based plasma etching process, and the second etching process is one of a nitrogen-based plasma etching process and an oxygen-based plasma etching process.

11. The method of claim 9, wherein the dielectric layer is partially etched.

12. The method of claim 9,
wherein each sidewall of the second lower metal, the second barrier metal, the second dielectric layer and the second metal nitride is aligned with each other.

13. A semiconductor device manufacturing method, the method comprising:
forming a first lower metal, a first barrier metal, a first dielectric layer and a first metal nitride, sequentially, on a substrate to form a metal/insulator/metal (MIM) capacitor, wherein a first hard mask is directly disposed on the first metal nitride and the first dielectric layer, and comprising an insulating layer;
forming a second lower metal, a second barrier metal, a second dielectric layer and a second metal nitride, sequentially, on the substrate to form a thin film resistor (TFR), wherein a second hard mask is directly disposed on the second metal nitride, and comprising a same material as the first hard mask;
forming an inter-metal dielectric layer to cover the MIM capacitor and the thin film resistor;
forming a first via connecting the first barrier metal and forming through the first hard mask and the first dielectric layer in the MIM capacitor;
forming a second via connecting the first metal nitride and forming through the first hard mask in the MIM capacitor; and
forming a third via connecting the second metal nitride and forming through the second hard mask in the TFR,
wherein the first metal nitride is enclosed by the first hard mask and the first dielectric layer.

14. The method of claim 13,
wherein each sidewall of the second lower metal, the second barrier metal, the second dielectric layer and the second metal nitride is aligned with each other.

15. The method of claim 13,
wherein the first dielectric layer has thin and thick portions, and
wherein the thin portion is located outside from the first metal nitride, and the thick portion is located under the first metal nitride.

16. The method of claim 15,
wherein the first hard mask is in direct contact with a top and side surfaces of the first metal nitride, and
wherein the first hard mask is in direct contact with the thin and thick portions of the first dielectric layer.

17. The method of claim 13, further comprising:
forming a lower metal layer, a barrier metal layer, a dielectric layer and a metal nitride layer, sequentially, on the substrate;
performing etching the metal nitride layer, thereby forming the first metal nitride and the second metal nitride;
forming a hard mask layer directly disposed on the first metal nitride, the second metal nitride and the dielectric layer; and
performing etching the hard mask layer, the dielectric layer, the barrier metal layer and the lower metal layer to form the first hard mask, the second hard mask, the first metal nitride, the second metal nitride, the first dielectric layer, the second dielectric layer, the first barrier metal, the second barrier metal, the first lower metal and a second lower metal.

* * * * *